(12) United States Patent
Kim

(10) Patent No.: US 8,277,107 B2
(45) Date of Patent: Oct. 2, 2012

(54) LIGHT EMITTING APPARATUS AND LIGHT UNIT HAVING THE SAME

(75) Inventor: Kyong Jun Kim, Gwangju (KR)

(73) Assignee: LG Innotek Co., Ltd., Seoul (KR)

( * ) Notice: Subject to any disclaimer, the term of this patent is extended or adjusted under 35 U.S.C. 154(b) by 0 days.

(21) Appl. No.: 13/240,871

(22) Filed: Sep. 22, 2011

(65) Prior Publication Data

US 2012/0007136 A1    Jan. 12, 2012

Related U.S. Application Data

(63) Continuation of application No. 12/365,483, filed on Feb. 4, 2009, now Pat. No. 8,052,321.

(30) Foreign Application Priority Data

Feb. 5, 2008    (KR) .................. 10-2008-0011761

(51) Int. Cl.
*F21V 7/04*    (2006.01)
(52) U.S. Cl. .................. 362/631; 362/249.02; 362/253; 362/545; 362/612; 362/630
(58) Field of Classification Search .................. 362/227, 362/234, 249.01–249.02, 253, 543–545, 362/612–613, 630–631, 800, 249.04, 646; 257/98–100
See application file for complete search history.

(56) References Cited

U.S. PATENT DOCUMENTS

| 5,446,623 A | 8/1995 | Kanetake |
| 2007/0170449 A1 | 7/2007 | Anandan |

FOREIGN PATENT DOCUMENTS

| JP | 08-191111 A | 7/1996 |
| JP | 8-248435 A | 9/1996 |
| JP | 11-133394 A | 5/1999 |
| KR | 10-2004-0058418 A | 7/2004 |

OTHER PUBLICATIONS

English language machine translation of Japanese Publication No. 11-13394-A (May 21, 1999).
English language machine translation of Japanese Publication No. 8-191111-A (Jul. 23, 2009).
English language machine translation of Japanese Publication No. 8-248435-A (Sep. 27, 1996).
English language machine translation of Korean Publication No. 10-2004-0058418-A (Jul. 5, 2004).

*Primary Examiner* — Stephen F Husar
*Assistant Examiner* — Meghan Dunwiddie
(74) *Attorney, Agent, or Firm* — Birch, Stewart, Kolasch & Birch, LLP

(57) ABSTRACT

Provides are a light emitting apparatus and a light unit having the same. The light emitting apparatus comprises a light emitting device comprising a light emitting element and a plurality of external leads, and a plurality of electrode pads under the light emitting device.

20 Claims, 4 Drawing Sheets

LIGHT EMITTING APPARATUS AND LIGHT UNIT HAVING THE SAME

CROSS-REFERENCE TO RELATED APPLICATIONS

The present application is a continuation of U.S. application Ser. No. 12/365,483, filed Feb. 4, 2009, now U.S. Pat. No. 8,052,321, which claims priority under 35 U.S.C. 119 to Korean Patent Application No. 10-2008-0011761 (filed on Feb. 5, 2008), which is hereby incorporated by reference in its entirety.

BACKGROUND

A light emitting diode (LED) constitutes a light emitting source by using a compound semiconductor material, such as a GaAs-based compound semiconductor material, an AlGaAs-based compound semiconductor material, a GaN-based compound semiconductor material, an InGaN-based compound semiconductor material or an InGaAlP-based compound semiconductor material.

The LED is packaged and used as a light emitting device for emitting light having various colors. Such an LED is used as a light source in various fields, such as a lightening indicator for displaying colors, a character indicator, and an image indicator.

SUMMARY

Embodiments provide a light emitting apparatus comprising an improved tilt between a light emitting device and a board, and a light unit having the same.

Embodiments provide a light emitting apparatus, in which a lead electrode of a light emitting device has the same shape as a pad of a board, and a light unit having the same.

Embodiments provide a light emitting apparatus, in which a plurality of light emitting devices are mounted on a flexible board with a stiffener thereunder, and a light unit having the same.

An embodiment provides a light emitting apparatus comprising: a light emitting device comprises a light emitting element and a plurality of external leads; and a plurality of electrode pads under the light emitting device.

An embodiment provides a light emitting apparatus comprising: a plurality of light emitting devices comprising a light emitting element and a plurality of external leads; and a flexible board comprising a plurality of electrode pads thereon electrically connected to the external leads, and a stiffener thereunder.

An embodiment provides a light unit comprising: a plurality of light emitting devices comprising a light emitting element and a plurality of external leads; a board comprising a plurality of electrode pads electrically connected to the plurality of light emitting devices; and a light guide plate on one side of the light emitting device.

The details of one or more embodiments are set forth in the accompanying drawings and the description below. Other features will be apparent from the description and drawings, and from the claims.

DETAILED DESCRIPTION OF THE EMBODIMENTS

Hereinafter, a light emitting apparatus and a light unit having the same according to embodiments will be described in detailed with reference to the accompanying drawings.

Figure 1:
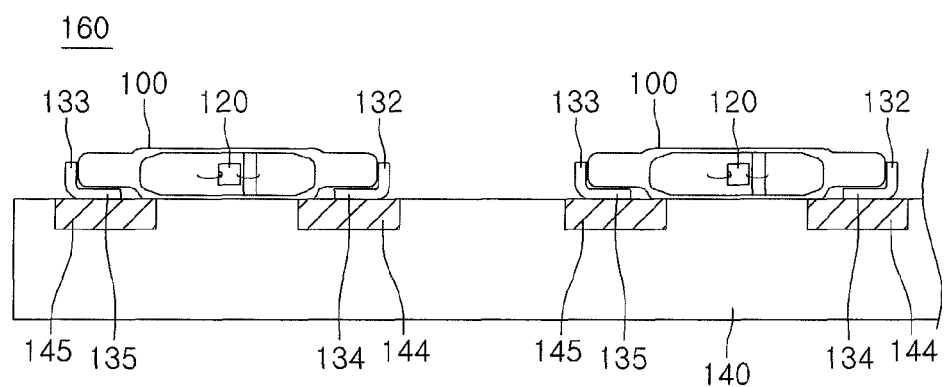
FIG. 1 is a side sectional view of a light emitting apparatus according to a first embodiment.
Figure 2:
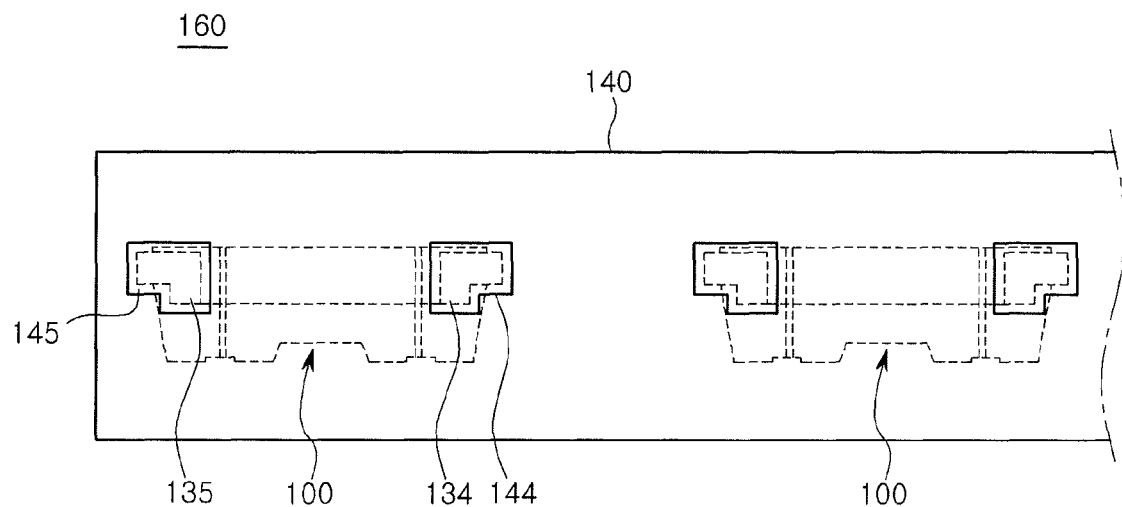
FIG. 2 is a projection plan view of a light emitting device on a board in FIG. 1.

FIG. 1 is a side sectional view of a light emitting apparatus according to a first embodiment, and FIG. 2 is a projection plan view of a light emitting device on a board in FIG. 1.

Referring to FIGS. 1 and 2, the light emitting apparatus 160 comprises a light emitting device 100 and a board 140.

The light emitting device 100 comprises a light emitting diode (LED) chip 120 and a plurality of lead terminals 132 and 133. The light emitting device 100 emits a color light, such as a red color, a green color and a blue color, or emits a white color.

At least one LED chip 120 may be arranged in each light emitting device. For example, the light emitting device may selectively comprise color LED chips, such as a red LED chip, a blue LED chip, a green LED chip, and a yellow green LED chip.

First ends of the lead terminals 132 and 133 are electrically connected to the LED chip 120, and external leads 134 and 135 being second ends of the lead terminals 132 and 133 are disposed under the light emitting device 100.

The board 140 comprises a flexible PCB (printed circuit board), and a plurality of electrode pads 114 and 145 are disposed over the board 140. The electrode pads 144 and 145 may be formed in the same shape as the external leads 134 and 135 of the light emitting device 100, and may be larger in size than the external leads 134 and 135 of the light emitting device 100. For example, both of the external leads 134 and 135 and the electrode pads 144 and 145 may be formed in a circular shape, a polygonal shape, or a shape bent at a predetermined angle. The electrode pads 144 and 145 may be 1-1.5 times larger in size than the external leads 134 and 135.

The plurality of light emitting devices 100 are arranged on the board 140 in a predetermined direction, and the external leads 134 and 135 of the light emitting device 100 are electrically connected to the electrode pads 144 and 145 on the board 140. The external leads 134 and 135 of the light emitting device 100 are bonded to the electrode pads 144 and 145 on the board 140 by solders through a surface mount technology (SMT) process. In this case, the external leads 134 and 135 of the light emitting device 100 may be bonded within regions of the electrode pads 144 and 145. Accordingly, since the light emitting device 100 is arranged in parallel to the electrode pads 144 and 145 of the board 140, the tilt problem of the light emitting device 100 can be solved.

A tilt value of the light emitting device 100 may be within ±0.2 mm with respect to the top surface of the board 140.

Figure 3:
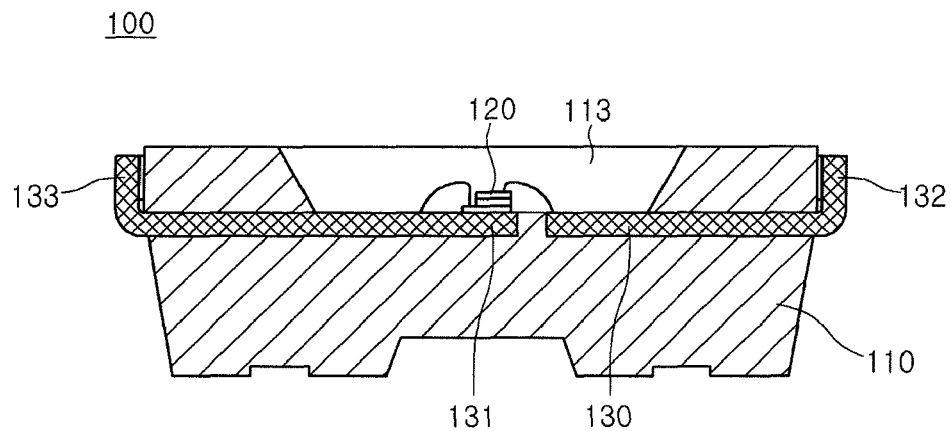
FIG. 3 is a side sectional view of the light emitting device in FIG. 1.
Figure 4:
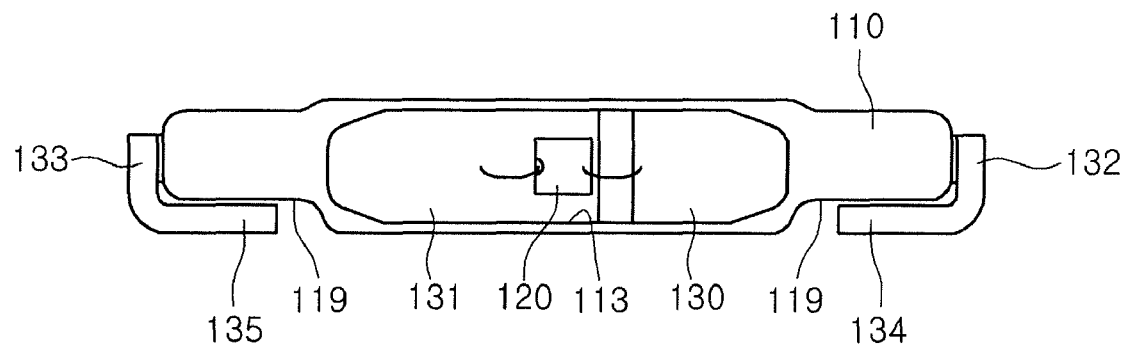
FIG. 4 is a front view of the light emitting device in FIG. 1.
Figure 5:
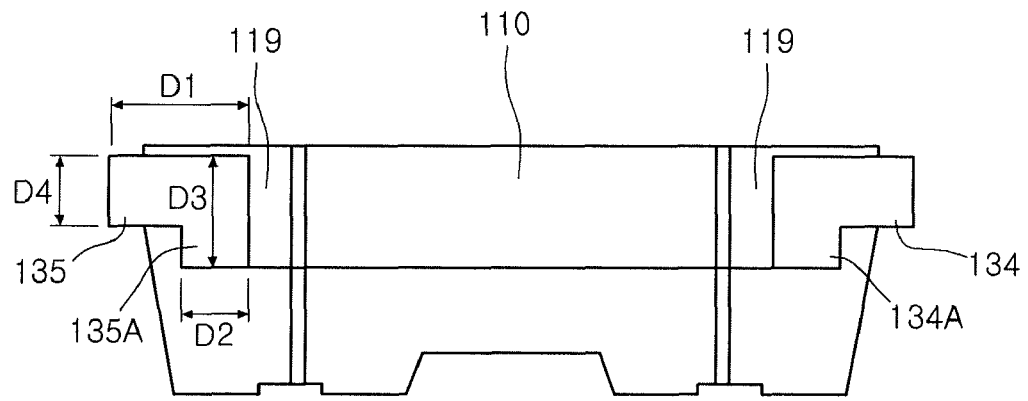
FIG. 5 is a bottom view of the light emitting device in FIG. 1.

FIG. 3 is a side sectional view of the light emitting device in FIG. 2, FIG. 4 is a front view of the light emitting device in FIG. 2, and FIG. 5 is a bottom view of the light emitting device in FIG. 2.

Referring to FIGS. 3 and 4, the light emitting device 100 may be implemented with a side view type package or a top view type package, and may be variously applied as a light source of an LCD device in a portable phone, a portable computer, etc., and a light emitting device of a lighting field. For convenience of explanation, the side view type package will be described as an example.

The light emitting device 100 comprises an LED chip 120, a package body 110 with an opening 113, and a plurality of lead terminals 132 and 133.

The package body 110 may be formed of at least one of printed circuit board (PCB), silicon, silicon carbide (SiC), aluminum nitride (AlN), poly phthalamide (PPA), and liquid crystal polymer, but the package body 110 is not limited thereto.

Furthermore, the package body 110 may be injection molded with injection material, or may be formed using an etching process, or may be formed of a PCB, but the package body 110 is not limited thereto. The injection material can form the package body in a desired shape by using press, for example, Cu/Ni/Ag alloy, and a material of structure of such an injection material may be changed.

The opening 113 may be formed on one side of the package body 110. The opening 113 serves to perform a reflection cup function and may be formed with a predetermined depth and in a predetermined shape. A circumference surface of the opening 113 may be formed vertically or slopingly, but it is not limited thereto. Furthermore, according to the current embodiment, the opening 113 may not be formed in the package body 110.

The plurality of lead terminals 132 and 133 are disposed in the package body 110 and may be implemented lead frames.

First ends 130 and 131 of the lead terminals 132 and 133 may be exposed to the opening 113 by passing through both sides of the package body 110. The external leads 134 and 135 being second ends of the lead terminals 132 and 133 are disposed under the package body 110. Accordingly, the external leads 134 and 135 of the lead terminals 132 and 133 may be disposed under the package body 110 through a forming process.

The first ends 130 and 131 of the lead terminals 132 and 133 are electrically connected to the LED chip 120 within the opening 113. The LED chip 120 and the first ends 130 and 131 of the lead terminals 132 and 133 may be connected together by wires or may be connected together by die bonding or flip boding, but it is not limited thereto. The LED chip 120 comprises a nitride semiconductor light emitting device.

The package body 110 may comprise semiconductor devices such as a light receiving device or a protecting device, but it is not limited thereto. The protecting device may be implemented with a Zener diode. The Zener diode protects the LED chip from electrostatic discharge (ESD).

A resin (not shown) is formed in the opening 113. The resin protects the LED chip 120 by using silicon or transparent resin such as epoxy. At least one kind of phosphor may be added to the resin, but it is not limited thereto. The surface of the resin may be formed in a flat shape, a concave shape, or a convex shape, but it is not limited thereto.

Referring to FIGS. 4 and 5, the external leads 134 and 135 of the lead terminals 132 and 133 may be formed such that they are received in grooves 119 formed on both bottom sides of the package body 110. The external leads 134 and 135 are formed with a flat plate with a predetermined shape and it can improve adhesiveness of the solders in the SMT process.

Referring to FIG. 5, the external leads 134 and 135 may be formed in a circular shape, an elliptical shape, a polygonal shape, or a shape in which some portions of the external leads 134 and 135 are cut or bent at a predetermined angle. As an example, the external leads 134 and 135 may be formed in a shape in which their inner sides 134A and 135A extend in a rear surface direction of the package body 110 with respect to the forming direction, for example, a "⊣" shape.

Figure 6:
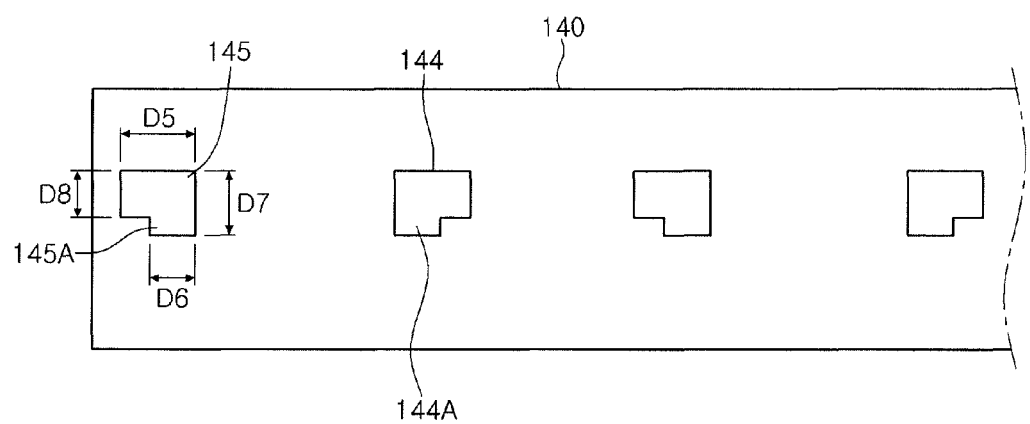
FIG. 6 is a plan view of the board in FIG. 1.

FIG. 6 is a plan view of the board in FIG. 1.

Referring to FIG. 6, a plurality of electrode pads 144 and 145 are disposed on the board 140. The electrode pads 144 and 145 may be formed in the same shape as the external leads (134 and 135 in FIG. 5). The electrode pads 144 and 145 may be formed in a circular shape, an elliptical shape, a polygonal shape, or a shape bent at a predetermined angle. As an example, the electrode pads 144 and 145 may be formed in a shape in which their inner sides 144A and 145A protrude from a rectangular shape, for example, a "⊣" shape.

Referring to FIGS. 5 and 6, the side lengths D5, D6, D7 and D8 of the electrode pads 144 and 145 may be equal to or greater than the side lengths D1, D2, D3 and D4 of the external leads 134 and 135. Herein, the side lengths D5, D6, D7 and D8 of the electrode pads 144 and 145 are 1-1.5 times longer than the side lengths D1, D2, D3 and D4 of the external leads 134 and 135. The opposite sides D1 and D5, D2 and D6, D3 and D7, D4 and D8 are formed to correspond to each other in the same shapes.

Furthermore, the plurality of electrode pads 144 and 145 have a shape symmetrical to one another, and the inner regions may be larger than the outer regions. Moreover, the plurality of external leads 134 and 135 may be formed with sizes of the corresponding regions at the corresponding positions of the electrode pads 144 and 145.

The electrode pads 144 and 145 may be larger in size than the external leads 134 and 135. For example, the electrode pads 144 and 145 may be 1-1.5 times larger in size than the external leads 134 and 135.

Since the entire regions of the external leads 134 and 135 of the light emitting device 100 are contacted within the electrode pads 144 and 145 of the board 140, it is possible to prevent the inclination of the center of gravity applied to both sides of the light emitting device 100.

Furthermore, the electrode pads 144 and 145 of the board 140 can solve the tilt problem of the dispensed solder thereon, and can also solve the heat dissipation problem through the uniform contact with the external leads 134 and 135.

Figure 7:
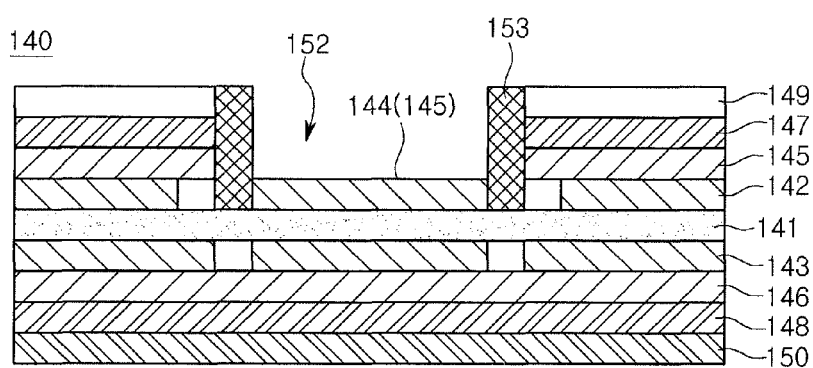
FIG. 7 is a detailed side sectional view of the board in FIG. 1.

FIG. 7 is a detailed side sectional view of the board in FIG. 1.

Referring to FIG. 7, the board 140 is a double side flexible circuit board and comprises a base film 141, first and second copper foil layers 142 and 143, first and second adhesive layers 145 and 146, first and second coverlay layers 147 and 148, an insulating ink layer 149, a stiffener 150, and a solder resist 153.

The base film 141 may comprise a polyimide film, and the first and second copper foil layers 142 and 143 are attached to both sides of the base film 141 by using a base adhesive.

Predetermined circuit patterns may be formed in the first copper foil layer 142 and/or the second copper foil layer 143 and may be connected together through interface such as vias, via holes, or through-holes.

A plating layer (not shown) may be formed on/under the first and second copper foil layers 142 and 143. A gold plating layer (not shown) may be formed in an opened region 152 of the first copper foil layer 142 by an electroless plating process in order to protect the circuit patterns and prevent their oxidation. A copper plating layer may be formed in regions other than the opened region.

The opened region 152 of the first copper foil layer 142 serves as the electrode pads 144 and 145. The first coverlay layer 147 is attached to the top of the first coil layer 152A by using the first adhesive layer 145, and the insulating ink layer 149 is formed on the first coverlay layer 147.

The insulating ink layer 149 is coated using a permanent ink (photo solder resist ink (PSR)) which is a permanent compound having durability in physical and chemical environments. Accordingly, the insulating ink layer 149 can protect the circuits and prevent the solder overlapping phenomenon between the circuits during the mounting of parts.

The second coverlay layer 148 is attached to the bottom of the second copper foil layer 143 by using the second adhesive layer 146, and the stiffener 150 is attached to the bottom of the second coverlay layer 148.

The first coverlay layer 147 and the second coverlay layer 148 may be formed of polyimide. The stiffener 150 may be implemented with a polyimide film, and it reinforces the stiffness of the board 140 and prevents the bending thereof. The stiffener 150 prevents the tilt caused by the light emitting device (100 in FIG. 1) mounted by an SMT process.

On the top of the board 140, a portion of the first copper foil layer 142 is opened to expose the electrode pads 144 and 145. A solder resist 153 may be coated in an entire or partial surrounding of the opened region of the first copper foil layer 142. Herein, after the light emitting device 100 is mounted on the electrode pads 144 and 145, the solder resist 153 prevents the contamination of the mounted region and reduces the tilt of the mounted light emitting device. The thickness or height of such a solder resist 153 may be changed.

Although the board 140 has been described with reference to the single-side exposed structure of the electrode pads 144 and 145, it can also be implemented with a double-side exposed structure. Furthermore, the board 140 may be changed within the technical scope of the embodiments.

Figure 8:
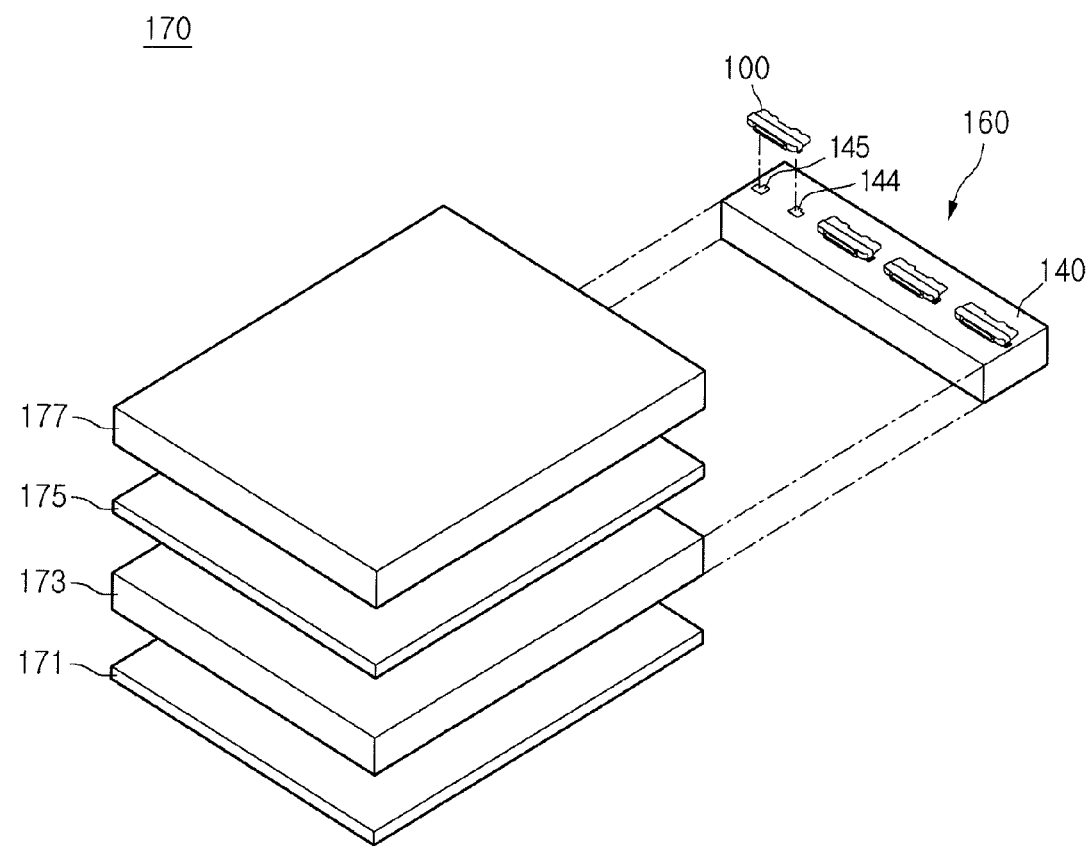
FIG. 8 is a perspective view of a light unit according to a second embodiment.

FIG. 8 is a perspective view of a display device according to a second embodiment.

Referring to FIG. 8, the display device 170 comprises a light emitting apparatus 160, a light guide plate 173, a reflection plate 171, an optical sheet 175, and a display panel 177. The light emitting apparatus 160, the light guide plate 173, the reflection plate 171, and the optical sheet 175 may be defined as a light unit.

The light emitting apparatus 160 comprises a plurality of light emitting devices 100 on a board 140 and is disposed in one side of the light guide plate 173. The light emitting apparatus 160 may be disposed on either or both sides of the light guide plate 173, but it is not limited thereto.

The light emitting apparatus 160 comprises the light emitting devices 100 and the board 140 and emits color lights, such as a red color, a green color and a blue color, or emits a white color.

The board 140 may be implemented with a flexible board, and electrode pads 144 and 145 have the same shapes as the lead terminals (134 and 135 in FIG. 1) with the larger sizes.

Therefore, the light emitting devices 100 mounted on the board 140 is not almost tilted. Furthermore, the stiffener (150 in FIG. 7) of the board 140 supports the board 140 in order not to be tilted in any one direction when boding the light emitting device 100. Thus, it is possible to prevent the tilt problem of the light emitting device 100 and improve the electrical reliability of the light emitting device 100.

The light guide plate 173 serves as a light guide panel (LGP). The light guide plate 173 may comprise reflection patterns on the rear surface thereof, but it is not limited thereto. The light guide plate 173 guides light incident from the light emitting apparatus 160, and reflects the guided light toward the panel direction. In this case, the surface light is irradiated onto the light guide plate 173.

The tilt problem of the light emitting devices 100 in the light emitting apparatus 160 can be solved. In this case, it is possible to prevent the light leakage phenomenon that some of the light emitted from the light emitting device 100 leaks out. Furthermore, it is possible to solve the problem that a portion of the light guide plate 173 becomes dark.

The reflection plate 171 may be disposed on the rear surface of the light guide plate 173, or may be disposed on the rear surface of the light guide plate 173 and a side where no light is incident.

The reflection plate 171 reflects light leaking downward through the light guide plate 173 toward the direction of the panel.

At least one optical sheet 175 may be disposed on the light guide plate 173 and may comprise a diffusion sheet, a prism sheet, and a brightness enhancement sheet. The diffusion sheet is disposed on the light guide plate 173 to diffuse the incident light. The prism sheet may comprise a horizontal prism sheet and/or a vertical prism sheet, and a brightness enhancement sheet. The prism sheet condenses the light diffused by the diffusion sheet toward a light emission region.

The display panel 177 is disposed on the optical sheet 175 to display information according to the light irradiated from the light unit. A polarizer may be attached to the display panel 177, but it is not limited thereto.

In the description of the embodiments, it will be understood that when a layer (or film), region, pattern or component is referred to as being 'on' or 'under' another layer (or film), region, or patterns, the terminology of 'on' and 'under' comprises both the meanings of 'directly' and 'indirectly'.

Any reference in this specification to "one embodiment," "an embodiment," "example embodiment," etc., means that a particular feature, structure, or characteristic described in connection with the embodiment is comprised in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting apparatus, comprising:
a board including a plurality of electrode pads;
a body having a cavity on the board;
a light emitting diode in the cavity; and
a plurality of lead electrodes each including first and second ends, the first end disposed in the cavity and the second end disposed on a lower surface and a side surface of the body.

2. The light emitting apparatus according to claim 1, wherein the second end is attached to the corresponding electrode pad.

3. The light emitting apparatus according to claim 1, wherein the electrode pad has a larger size than the second end.

4. The light emitting apparatus according to claim 1, wherein the light emitting diode is formed on the first end in the cavity.

5. The light emitting apparatus according to claim 1, wherein the lead electrode is formed passing through the body from the first end to the second end.

6. The light emitting apparatus according to claim 1, wherein first and second lead electrode of the plurality of the lead electrodes are spaced apart from each other in the cavity.

7. The light emitting apparatus according to claim 6, wherein the light emitting diode is formed on one of the first and second lead electrodes.

8. The light emitting apparatus according to claim 7, wherein the light emitting diode is electrically connected to the first and second lead electrode.

9. A light emitting apparatus, comprising:
a board including a plurality of electrode pads;
a body having a cavity on the board;
a light emitting diode in the cavity; and
a plurality of lead electrodes each including first and second ends, the first end disposed in the cavity and the second end disposed on a lower surface of the body,
wherein the second end has substantially the same shape as the electrode pad.

10. The light emitting apparatus according to claim 9, wherein the second end has 'L' shape with a bent portion that faces a top surface of the board.

11. The light emitting apparatus according to claim 10, wherein the electrode pad has 'L' shape with a bent portion.

12. The light emitting apparatus according to claim 11, wherein an overall region of the second end contacts the electrode pad.

13. The light emitting apparatus according to claim 9, wherein the electrode pad has a larger size than the second end.

14. The light emitting apparatus according to claim 9, wherein the electrode pad has 1 times to 1.5 times larger in size than the second end.

15. The light emitting apparatus according to claim 9, wherein the light emitting diode is formed on the first end in the cavity.

16. The light emitting apparatus according to claim 9, wherein the lead electrode is formed passing through the body from the first end to the second end.

17. The light emitting apparatus according to claim 1, wherein the second end of a first lead electrode among the plurality of lead electrodes and a second end of a second lead electrode are symmetrical to each other with respect to a center line of the body.

18. The light emitting apparatus according to claim 1, wherein the second end of each electrode extends from the first end to the lower surface of the body.

19. The light emitting apparatus according to claim 9, wherein the second end of a first lead electrode among the plurality of lead electrodes and the second end of a second lead electrode are symmetrical to each other with respect to a center line of the body.

20. The light emitting apparatus according to claim 9, wherein the second end of each electrode extends from the first end to the lower surface of the body.

* * * * *